US011523537B2

(12) United States Patent
Chen et al.

(10) Patent No.: US 11,523,537 B2
(45) Date of Patent: Dec. 6, 2022

(54) LIQUID-COOLING HEAT DISSIPATION DEVICE

(71) Applicant: Auras Technology Co., Ltd., New Taipei (TW)

(72) Inventors: Chien-Yu Chen, New Taipei (TW); Tian-Li Ye, New Taipei (TW); Jen-Hao Lin, New Taipei (TW); Chien-An Chen, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 183 days.

(21) Appl. No.: 17/114,814

(22) Filed: Dec. 8, 2020

(65) Prior Publication Data

US 2021/0195793 A1 Jun. 24, 2021

Related U.S. Application Data

(60) Provisional application No. 62/950,146, filed on Dec. 19, 2019.

(30) Foreign Application Priority Data

Nov. 12, 2020 (TW) .................................. 109139587

(51) Int. Cl.
*H05K 7/20* (2006.01)
(52) U.S. Cl.
CPC ..... *H05K 7/20263* (2013.01); *H05K 7/20409* (2013.01)

(58) Field of Classification Search
CPC ............ H05K 7/20263; H05K 7/20409; H01L 23/473
See application file for complete search history.

(56) References Cited

U.S. PATENT DOCUMENTS 9,795,064 B2* 10/2017 Aoki .................. H05K 7/20772
10,431,524 B1* 10/2019 Lan .................... H05K 7/20772
2017/0235350 A1* 8/2017 Tsai ...................... H01L 23/473
165/80.4

* cited by examiner

*Primary Examiner* — Emmanuel E Duke
(74) *Attorney, Agent, or Firm* — Muncy Geissler Olds & Lowe P.C.

(57) ABSTRACT

A liquid-cooling heat dissipation device includes a water-cooling module, a water-tank module, a power module, a first and a second water-cooling radiators. The water-cooling module includes a base, a plate, an isolating structure and a heat-conducting unit. The isolating structure connects between the base and the plate. The plate, the isolating structure and the base define a first chamber. The isolating structure and the plate define a second and a third chambers. The first, the second and the third chambers are isolated from each other. The heat-conducting unit is partially located within the first chamber and partially exposed from the base. The first and the second water-cooling radiators connect to the plate and communicate between the water-cooling module and the water-tank module. The power module drives a medium to flow between the water-cooling module and the water-tank module through the first and the second water-cooling radiators.

16 Claims, 8 Drawing Sheets

LIQUID-COOLING HEAT DISSIPATION DEVICE

RELATED APPLICATIONS

This application claims priority to U.S. Provisional Application Ser. No. 62/950,146 filed Dec. 19, 2019, and Taiwanese Application Serial Number 109139587 filed Nov. 12, 2020, which are herein incorporated by reference.

BACKGROUND

Technical Field

The present disclosure relates to liquid-cooling heat dissipation devices.

Description of Related Art

With the increase of living standards of people nowadays, the demand of people on computer equipment has also been increasing. Correspondingly, in order to fulfill the increasing demand of consumers, manufacturers are working hard to improve the computer equipment.

Apart from increasing the performance and functions of computer equipment, for example, the method to effectively enhance the cooling effect of the heat dissipation device disposed inside the computer equipment is undoubtedly an important issue which the industry highly concerns.

SUMMARY

A technical aspect of the present disclosure is to provide a liquid-cooling heat dissipation device, which can effectively reduce the overall resistance generated when the air flow penetrates through the liquid-cooling heat dissipation device, such that the effect of heat dissipation of the liquid-cooling heat dissipation device is enhanced.

According to an embodiment of the present disclosure, a liquid-cooling heat dissipation device includes a water-cooling module, a water-tank module, a first water-cooling radiator, a second water-cooling radiator and a power module. The water-cooling module includes a base, a top plate, an isolating structure and a heat-conducting unit. The top plate includes a first subsidiary top plate, a second subsidiary top plate and a third subsidiary top plate. The first subsidiary top plate is connected between the second subsidiary top plate and the third subsidiary top plate. The isolating structure is connected between the base and the top plate. The second subsidiary top plate, the third subsidiary top plate, the isolating structure and the base define a first chamber therebetween. The isolating structure and the first subsidiary top plate define a second chamber and a third chamber therebetween. The first chamber, the second chamber and the third chamber are isolated from each other. The heat-conducting unit is connected with the base. The heat-conducting unit is at least partially located within the first chamber and at least partially exposed from the base. The heat-conducting unit is configured to abut against a heat source. The first water-cooling radiator is connected with the top plate and is communicated between the water-cooling module and the water-tank module. The second subsidiary top plate at least partially abuts against the first water-cooling radiator. The second water-cooling radiator is connected with the top plate and is communicated between the water-cooling module and the water-tank module. The third subsidiary top plate at least partially abuts against the second water-cooling radiator. The power module is configured to drive a working medium to flow between the water-cooling module and the water-tank module through the first water-cooling radiator and the second water-cooling radiator.

In one or more embodiments of the present disclosure, the isolating structure includes an isolating plate, a first isolating portion, a second isolating portion and a third isolating portion. The first isolating portion, the second isolating portion and the third isolating portion are respectively connected with the isolating plate and are configured to abut against the top plate. The first isolating portion and the second isolating portion define the second chamber therebetween. The second isolating portion and the third isolating portion define the third chamber therebetween.

In one or more embodiments of the present disclosure, the first subsidiary top plate has a plurality of first through holes, a plurality of second through holes, a plurality of third through holes and a plurality of fourth through holes. The second isolating portion is located between the second through holes and the third through holes. The second through holes are located between the first through holes and the second isolating portion. The third through holes are located between the fourth through holes and the second isolating portion. The second subsidiary top plate has a plurality of fifth through holes. The first through holes are located between the fifth through holes and the second through holes. The third subsidiary top plate has a plurality of sixth through holes. The fourth through holes are located between the sixth through holes and the third through holes. The isolating structure is located between the fifth through holes and the sixth through holes. The fifth through holes and the sixth through holes are respectively communicated with the first chamber.

In one or more embodiments of the present disclosure, the water-tank module includes a tank and a cover. The tank includes a base plate, a wall plate and a plurality of isolating pieces. The wall plate surrounds and connects to the base plate. The isolating pieces are respectively connected with the wall plate and the base plate to define a fourth chamber, a fifth chamber, a sixth chamber and a seventh chamber. The fourth chamber, the fifth chamber, the sixth chamber and the seventh chamber are isolated from each other. The base plate has a plurality of seventh through holes, a plurality of eighth through holes, a plurality of ninth through holes, a plurality of tenth through holes, a plurality of eleventh through holes and a plurality of twelfth through holes. The seventh through holes and the eighth through holes are respectively communicated with the fourth chamber. The ninth through holes are communicated with the fifth chamber. The tenth through holes are communicated with the sixth chamber. The eleventh through holes and the twelfth through holes are respectively communicated with the seventh chamber. The cover is configured to connect with the wall plate and the isolating pieces to seal the fourth chamber, the fifth chamber, the sixth chamber and the seventh chamber.

In one or more embodiments of the present disclosure, the base plate has a first opening and a second opening. The first opening is communicated with the fifth chamber. The second opening is communicated with the sixth chamber. The power module includes a pump. The pump is communicated with the first opening and the second opening to configure to exert a pressure to the working medium.

In one or more embodiments of the present disclosure, the first water-cooling radiator and the second water-cooling radiator are arranged along a first direction. The first water-cooling radiator includes a plurality of first cooling fins, a plurality of first pipelines, a plurality of second pipelines and a plurality of third pipelines. The second pipelines are located between the first pipelines and the third pipelines along the first direction. The first pipelines, the second pipelines and the third pipelines are respectively separated from each other and are at least partially arranged along a second direction. The second direction is substantially perpendicular to the first direction. The first pipelines are communicated between the fifth through holes and the seventh through holes. The second pipelines are communicated between the first through holes and the eighth through holes. The third pipelines are communicated between the second through holes and the ninth through holes. The first cooling fins are separated from each other along a third direction and are distributed between the first pipelines, the second pipelines and the third pipelines along the second direction. The third direction is perpendicular to the first direction and the second direction. The first pipelines, the second pipelines and the third pipelines are configured to allow the working medium to flow therein.

In one or more embodiments of the present disclosure, a quantity of the first pipelines is larger than a quantity of the second pipelines.

In one or more embodiments of the present disclosure, the second water-cooling radiator includes a plurality of second cooling fins, a plurality of fourth pipelines, a plurality of fifth pipelines and a plurality of sixth pipelines. The fifth pipelines are located between the fourth pipelines and the sixth pipelines along the first direction. The fourth pipelines, the fifth pipelines and the sixth pipelines are separated from each other and are respectively arranged along the second direction. The fourth pipelines are communicated between the third through holes and the tenth through holes. The fifth pipelines are communicated between the four through holes and the eleventh through holes. The sixth pipelines are communicated between the six through holes and the twelfth through holes. The second cooling fins are separated from each other along the third direction and are distributed between the fourth pipelines, the fifth pipelines and the sixth pipelines along the second direction. The fourth pipelines, the fifth pipelines and the sixth pipelines are configured to allow the working medium to flow therein.

In one or more embodiments of the present disclosure, a quantity of the sixth pipelines is larger than a quantity of the fifth pipelines.

In one or more embodiments of the present disclosure, the first water-cooling radiator and the second water-cooling radiator define a pressure relief space therebetween.

In one or more embodiments of the present disclosure, the liquid-cooling heat dissipation device further includes two side covers. The side covers respectively connect with a side of the water-cooling module and the water-tank module to cover the pressure relief space. The pressure relief space is located between the side covers.

In one or more embodiments of the present disclosure, the first water-cooling radiator and the second water-cooling radiator are arranged along a first direction. Each of the side covers includes a main cover, two tapered segments and two subsidiary covers. The main cover is connected between the tapered segments along the first direction. Each of the tapered segments is connected between the main cover and the corresponding one of the subsidiary covers. The main covers define a first distance therebetween. Each of the subsidiary covers and the corresponding one of the subsidiary covers define a second distance therebetween. The second distance is larger than the first distance.

In one or more embodiments of the present disclosure, the first water-cooling radiator further includes a plurality of third cooling fins. The third cooling fins correspond to the subsidiary covers in position.

In one or more embodiments of the present disclosure, the second water-cooling radiator further includes a plurality of fourth cooling fins. The fourth cooling fins correspond to the subsidiary covers in position.

In one or more embodiments of the present disclosure, the power module is located between the first water-cooling radiator and the second water-cooling radiator. The power module is communicated with the water-tank module or the water-cooling module.

In one or more embodiments of the present disclosure, the heat-conducting unit includes a heat-conducting plate and a heat-conducting structure. The heat-conducting plate is connected with the base and has a heat absorbing surface. The absorbing surface is away from the water-tank module and is configured to abut against the heat source. The heat-conducting structure is located within the first chamber and is connected with the heat-conducting plate.

When compared with the prior art, the above-mentioned embodiments of the present disclosure have at least the following advantages:

(1) After the working medium absorbs the heat of the heat source when flowing through the heat absorbing surface of the water-cooling module, the working medium flows within the water-cooling module, the second water-cooling radiator, the water-tank module and the first water-cooling radiator under the action of the power module, such that a fluid circulation is formed within the liquid-cooling heat dissipation device. Moreover, two occasions of heat dissipation to the working medium are respectively carried out when the working medium flows through the first water-cooling radiator and the second water-cooling radiator. Therefore, the effect of heat dissipation of the liquid-cooling heat dissipation device is greatly enhanced.

(2) Since the second distance between one of the subsidiary covers and the corresponding one of the subsidiary covers is larger than the first distance between one of the main covers and the other one of the main covers, when the air flow enters from the outside of the liquid-cooling heat dissipation device and sequentially passes through the second water-cooling radiator and the first water-cooling radiator, the air flow is guided by the tapered segments located between the main covers and the subsidiary covers such that the flowing speed of the air flow is increased. Thus, the effect of heat dissipation is effectively enhanced.

(3) When the cool air flow penetrates through the second water-cooling radiator, fluid resistance to the cool air flow is generated between the sixth pipelines, the fifth pipelines, the fourth pipelines and the second cooling fins. However, since the first water-cooling radiator and the second water-cooling radiator define the pressure relief space therebetween, when the cool air flow reaches the pressure relief space after penetrating through the second water-cooling radiator, the cool air flow no longer encounters any fluid resistance and is able to keep flowing towards the first water-cooling radiator. In this way, the process that the cool air flow flows through the second water-cooling radiator and the first water-cooling radiator sequentially to turn into the hot air flow becomes smoother, and the overall fluid resistance generated when penetrating through the liquid-cooling heat dissipation device is effectively reduced. Thus, the effect of heat dissipation of the liquid-cooling heat dissipation device is further enhanced.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
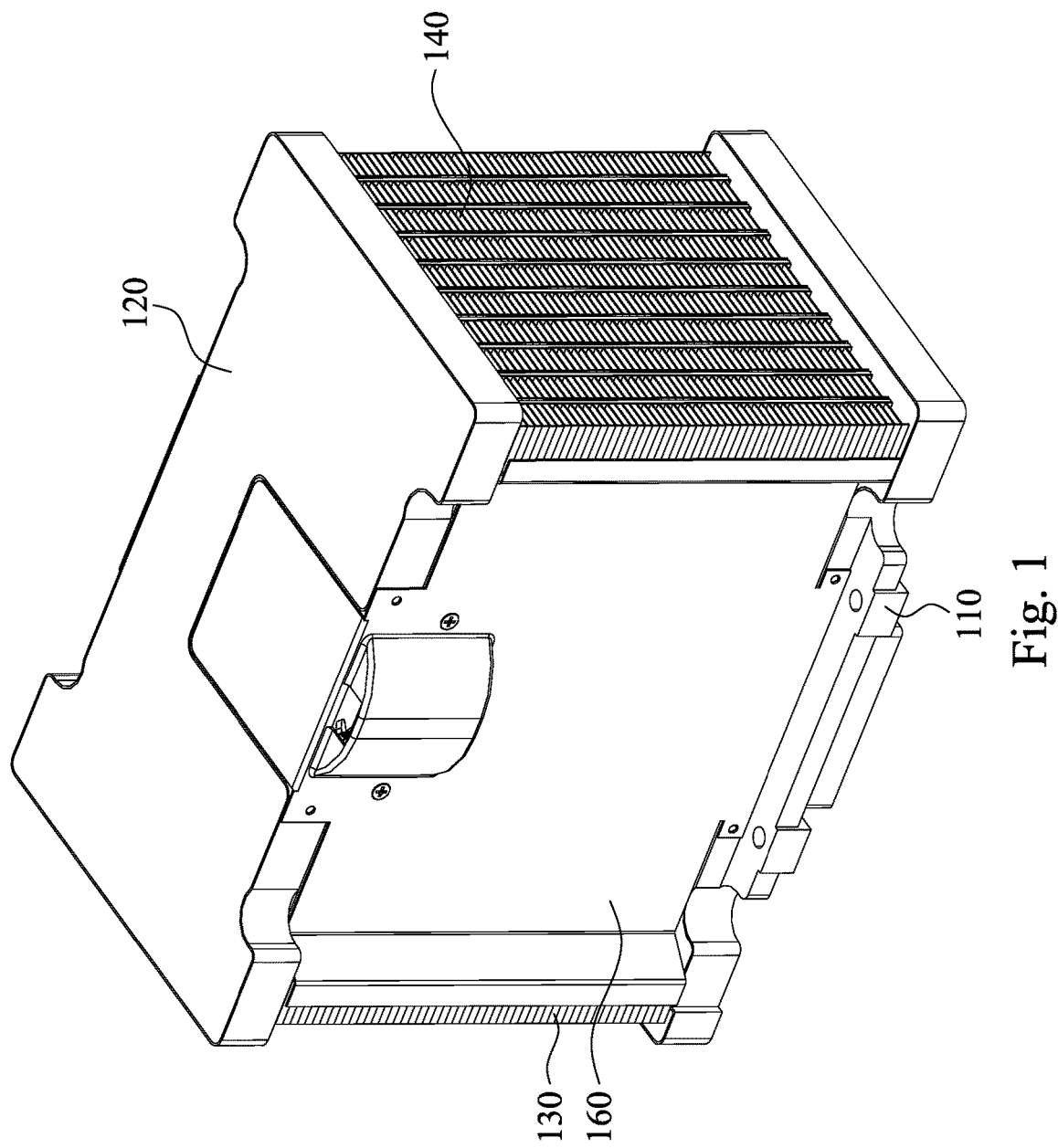
FIG. 1 is a schematic view of a liquid-cooling heat dissipation device according to an embodiment of the present disclosure.

Drawings will be used below to disclose embodiments of the present disclosure. For the sake of clear illustration, many practical details will be explained together in the description below. However, it is appreciated that the practical details should not be used to limit the claimed scope. In other words, in some embodiments of the present disclosure, the practical details are not essential. Moreover, for the sake of drawing simplification, some customary structures and elements in the drawings will be schematically shown in a simplified way. Wherever possible, the same reference numbers are used in the drawings and the description to refer to the same or like parts.

Unless otherwise defined, all terms (including technical and scientific terms) used herein have the same meanings as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
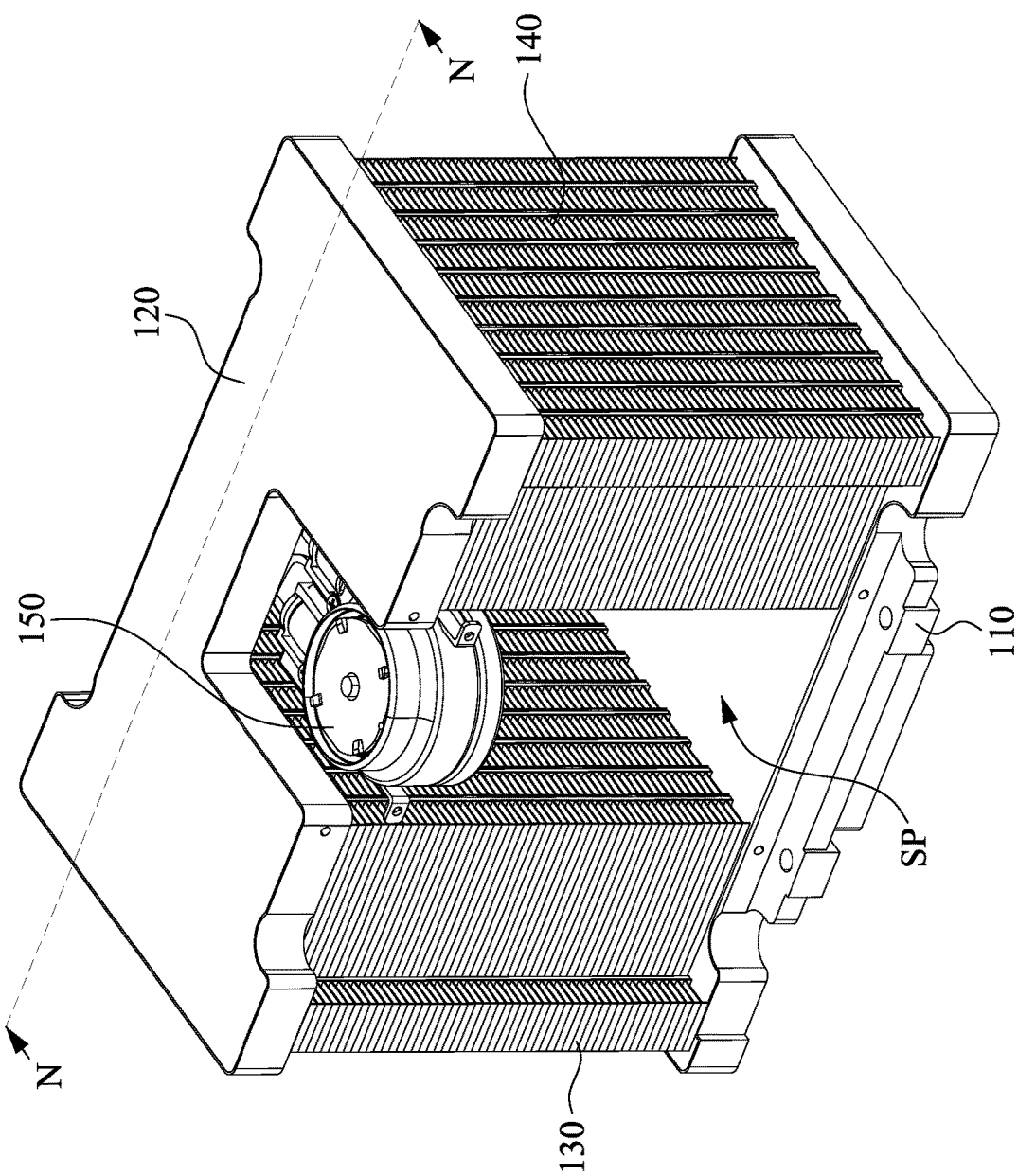
FIG. 2 is a schematic view of the liquid-cooling heat dissipation device of FIG. 1, in which the side covers are omitted.

Reference is made to FIGS. 1-2. FIG. 1 is a schematic view of a liquid-cooling heat dissipation device 100 according to an embodiment of the present disclosure. FIG. 2 is a schematic view of the liquid-cooling heat dissipation device 100 of FIG. 1, in which the side covers 160 are omitted. In this embodiment, as shown in FIGS. 1-2, a liquid-cooling heat dissipation device 100 includes a water-cooling module 110, a water-tank module 120, a first water-cooling radiator 130, a second water-cooling radiator 140 and a power module 150. The water-cooling module 110 is configured to abut against a heat source 200 (please refer to FIG. 4). The first water-cooling radiator 130 is communicated between the water-cooling module 110 and the water-tank module 120. The second water-cooling radiator 140 is also communicated between the water-cooling module 110 and the water-tank module 120. The first water-cooling radiator 130 and the second water-cooling radiator 140 define a pressure relief space SP therebetween. The power module 150 is configured to drive a working medium (not shown, can be a liquid or a gas) to flow between the water-cooling module 110 and the water-tank module 120 through the first water-cooling radiator 130 and the second water-cooling radiator 140. In practical applications, the liquid-cooling heat dissipation device 100 further includes two side covers 160 (please refer to FIG. 1, one of the two side covers 160 is located at the back of the liquid-cooling heat dissipation device 100 in the figure and is thus blocked and cannot be seen). The side covers 160 are respectively connected with a side of the water-cooling module 110 and the water-tank module 120 to cover the pressure relief space SP. In other words, the pressure relief space SP is located between the side covers 160. In order to make the structure of the liquid-cooling heat dissipation device 100 clear and easy to be understood, the side covers 160 are omitted in FIG. 2.

Figure 3:
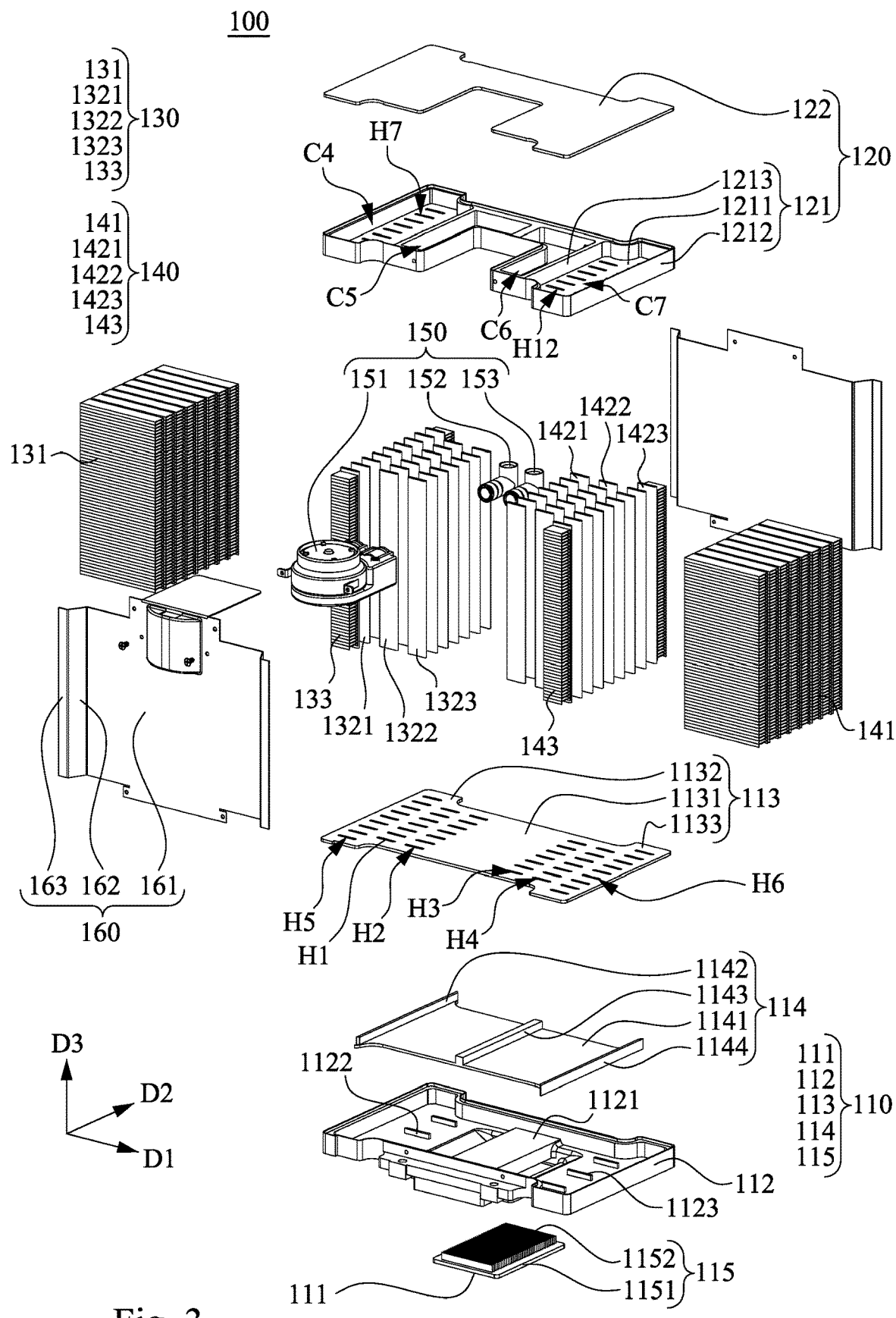
FIG. 3 is an exploded view of the liquid-cooling heat dissipation device of FIG. 1.
Figure 4:
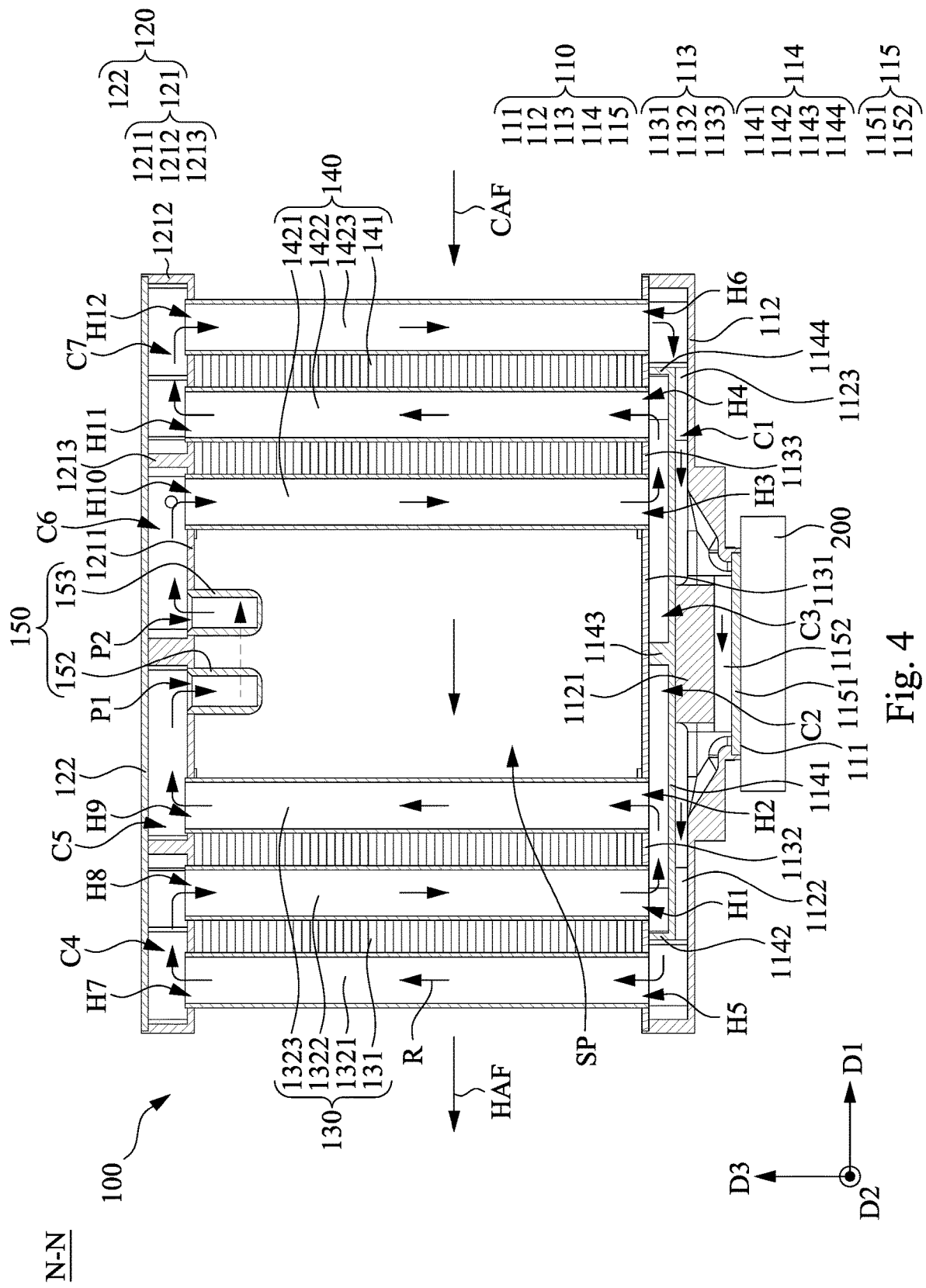
FIG. 4 is a sectional view along the section line N-N of FIG. 2.

Reference is made to FIGS. 3-4. FIG. 3 is an exploded view of the liquid-cooling heat dissipation device 100 of FIG. 1. FIG. 4 is a sectional view along the section line N-N of FIG. 2. In this embodiment, as shown in FIGS. 3-4, the water-cooling module 110 includes a base 112, a top plate 113, an isolating structure 114 and a heat-conducting unit 115. The top plate 113 includes a first subsidiary top plate 1131, a second subsidiary top plate 1132 and a third subsidiary top plate 1133. The first subsidiary top plate 1131 is connected between the second subsidiary top plate 1132 and the third subsidiary top plate 1133. The isolating structure 114 is connected between the base 112 and the top plate 113. To be specific, the second subsidiary top plate 1132, the third subsidiary top plate 1133, the isolating structure 114 and the base 112 define a first chamber C1 therebetween. The isolating structure 114 and the first subsidiary top plate 1131 define a second chamber C2 and a third chamber C3 therebetween. The first chamber C1, the second chamber C2 and the third chamber C3 are isolated from each other. This means the first chamber C1, the second chamber C2 and the third chamber C3 are not directly communicated with each other. The heat-conducting unit 115 is connected with the base 112. The heat-conducting unit 115 is at least partially located within the first chamber C1 and at least partially exposed from the base 112. The base 112 includes a diversion block 1121. The diversion block 1121 is connected between the isolating structure 114 and the heat-conducting unit 115. The heat-conducting unit 115 is configured to abut against the heat source 200. Furthermore, the first water-cooling radiator 130 is connected with the top plate 113 and is communicated between the water-cooling module 110 and the water-tank module 120, and the second subsidiary top plate 1132 at least partially abuts against the first water-cooling radiator 130. Similarly, the second water-cooling radiator 140 is also connected with the top plate 113 and is communicated between the water-cooling module 110 and the water-tank module 120, and the third subsidiary top plate 1133 at least partially abuts against the second water-cooling radiator 140.

In addition, as shown in FIGS. 3-4, the base 112 further includes at least one first supporting column 1122 and at least one second supporting column 1123. The first supporting column 1122 and the second supporting column 1123 are located in the first chamber C1. The diversion block 1121 is located between the first supporting column 1122 and the second supporting column 1123. When the isolating structure 114 is assembled on the base 112 and abuts against the diversion block 1121, the isolating structure 114 also abuts against the first supporting column 1122 and the second supporting column 1123 at the same time, such that the two sides of the isolating structure 114 are supported properly when the isolating structure 114 is assembled on the base 112.

In addition, as shown in FIGS. 3-4, the isolating structure 114 includes an isolating plate 1141, a first isolating portion 1142, a second isolating portion 1143 and a third isolating portion 1144. The first isolating portion 1142, the second isolating portion 1143 and the third isolating portion 1144 are respectively connected with the isolating plate 1141 and are configured to abut against the top plate 113. It is worth to note that, the first isolating portion 1142 and the second isolating portion 1143 define the second chamber C2 therebetween, and the second isolating portion 1143 and the third isolating portion 1144 define the third chamber C3 therebetween. In other words, the second isolating portion 1143 divides the second chamber C2 and the third chamber C3.

To be specific, as shown in FIGS. 3-4, the first subsidiary top plate 1131 has a plurality of first through holes H1, a plurality of second through holes H2, a plurality of third through holes H3 and a plurality of fourth through holes H4. The second isolating portion 1143 is located between the second through holes H2 and the third through holes H3. The second through holes H2 are located between the first through holes H1 and the second isolating portion 1143. The third through holes H3 are located between the fourth through holes H4 and the second isolating portion 1143. Moreover, the second subsidiary top plate 1132 has a plurality of fifth through holes H5. The first through holes H1 are located between the fifth through holes H5 and the second through holes H2, and the third subsidiary top plate 1133 has a plurality of sixth through holes H6. The fourth through holes H4 are located between the sixth through holes H6 and the third through holes H3. It is worth to note that, the isolating structure 114 is located between the fifth through holes H5 and the sixth through holes H6. The fifth through holes H5 and the sixth through holes H6 are respectively communicated with the first chamber C1.

In this embodiment, as shown in FIG. 4, the first through holes H1 and the second through holes H2 are respectively communicated with the second chamber C2, and the third through holes H3 and the fourth through holes H4 are respectively communicated with the third chamber C3.

Figure 5:
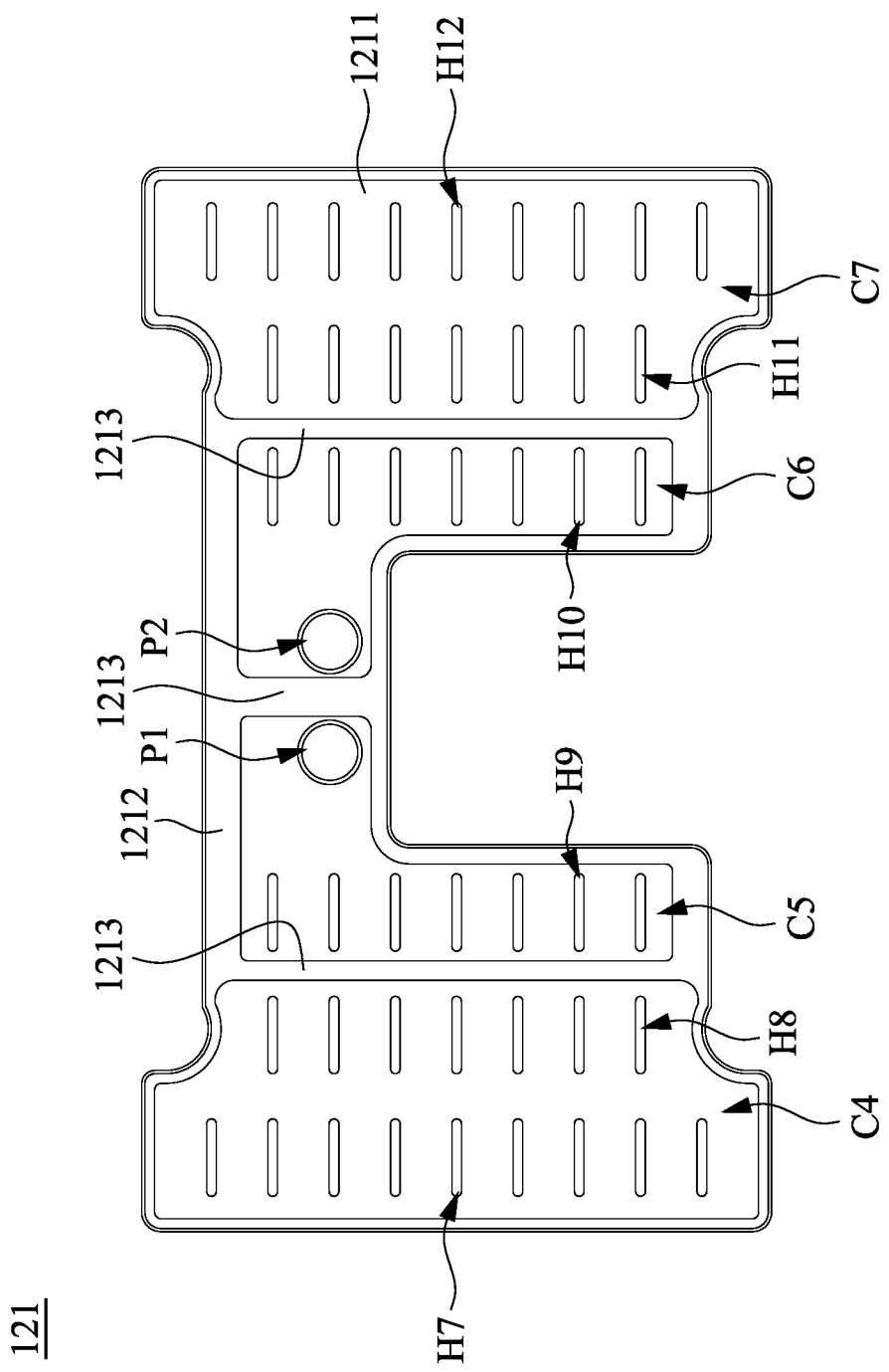
FIG. 5 is a top view of the tank of FIG. 3.

Reference is made to FIG. 5. FIG. 5 is a top view of the tank 121 of FIG. 3. As shown in FIGS. 3-5, the water-tank module 120 includes a tank 121 and a cover 122. The tank 121 includes a base plate 1211, a wall plate 1212 and a plurality of isolating pieces 1213. The wall plate 1212 surrounds and connects to the base plate 1211. The isolating pieces 1213 are respectively connected with the wall plate 1212 and the base plate 1211, in order to define a fourth chamber C4, a fifth chamber C5, a sixth chamber C6 and a seventh chamber C7. The fourth chamber C4, the fifth chamber C5, the sixth chamber C6 and the seventh chamber C7 are isolated from each other. This means the fourth chamber C4, the fifth chamber C5, the sixth chamber C6 and the seventh chamber C7 are not directly communicated with each other. The base plate 1211 has a plurality of seventh through holes H7, a plurality of eighth through holes H8, a plurality of ninth through holes H9, a plurality of tenth through holes H10, a plurality of eleventh through holes H11 and a plurality of twelfth through holes H12. The seventh through holes H7 and the eighth through holes H8 are respectively communicated with the fourth chamber C4. The ninth through holes H9 are communicated with the fifth chamber C5. The tenth through holes H10 are communicated with the sixth chamber C6. The eleventh through holes H11 and the twelfth through holes H12 are respectively communicated with the seventh chamber C7. The cover 122 is configured to connect with the wall plate 1212 and the isolating pieces 1213 to seal the fourth chamber C4, the fifth chamber C5, the sixth chamber C6 and the seventh chamber C7.

Moreover, the base plate 1211 has a first opening P1 and a second opening P2. The first opening P1 is communicated with the fifth chamber C5. The second opening P2 is communicated with the sixth chamber C6. The power module 150 includes a pump 151, a first connecting pipe 152 and a second connecting pipe 153. The pump 151 is configured to exert a pressure to the working medium. The first connecting pipe 152 is communicated between the pump 151 and the first opening P1, and the second connecting pipe 153 is communicated between the pump 151 and the second opening P2.

In the structural point of view, as shown in FIGS. 3-4, the first water-cooling radiator 130 and the second water-cooling radiator 140 are arranged along a first direction D1. The first water-cooling radiator 130 includes a plurality of first cooling fins 131, a plurality of first pipelines 1321, a plurality of second pipelines 1322 and a plurality of third pipelines 1323. The second pipelines 1322 are located between the first pipelines 1321 and the third pipelines 1323 along the first direction D1. The first pipelines 1321, the second pipelines 1322 and the third pipelines 1323 are respectively separated from each other and are at least partially arranged along a second direction D2. The second direction D2 is substantially perpendicular to the first direction D1.

In addition, in this embodiment, the first pipelines 1321 are communicated between the first chamber C1 and the fourth chamber C4 through the fifth through holes H5 and the seventh through holes H7. The second pipelines 1322 are communicated between the second chamber C2 and the fourth chamber C4 through the first through holes H1 and the eighth through holes H8. The third pipelines 1323 are communicated between the second chamber C2 and the fifth chamber C5 through the second through holes H2 and the ninth through holes H9. The first cooling fins 131 are separated from each other along a third direction D3 and are distributed between the first pipelines 1321, the second pipelines 1322 and the third pipelines 1323 along the second direction D2. The third direction D3 is perpendicular to the first direction D1 and the second direction D2. The first pipelines 1321, the second pipelines 1322 and the third pipelines 1323 are configured to allow the working medium to flow therein. In this embodiment, a quantity of the first pipelines 1321 is larger than a quantity of the second pipelines 1322.

In practical applications, the first cooling fins 131 can be chosen to be skived fins, or other fins of columnar shapes, flaky shapes or even irregular shapes. The gap between any adjacent two of the fins can allow an air flow to pass through. Moreover, under the condition that the contact area with the working medium is increased (such as increasing the density of arrangement), the heat can be transferred to the air flow more readily, such that the heat can be taken away by the air flow.

Moreover, the second water-cooling radiator 140 includes a plurality of second cooling fins 141, a plurality of fourth pipelines 1421, a plurality of fifth pipelines 1422 and a plurality of sixth pipelines 1423. The fifth pipelines 1422 are located between the fourth pipelines 1421 and the sixth pipelines 1423 along the first direction D1. The fourth pipelines 1421, the fifth pipelines 1422 and the sixth pipelines 1423 are separated from each other and are respectively arranged along the second direction D2.

Moreover, in this embodiment, the fourth pipelines 1421 are communicated between the third chamber C3 and the sixth chamber C6 through the third through holes H3 and the tenth through holes H10. The fifth pipelines 1422 are communicated between the third chamber C3 and the seventh chamber C7 through the fourth through holes H4 and the eleventh through holes H11. The sixth pipelines 1423 are communicated between the first chamber C1 and the seventh chamber C7 through the six through holes H6 and the twelfth through holes H12. The second cooling fins 141 are separated from each other along the third direction D3 and are distributed between the fourth pipelines 1421, the fifth pipelines 1422 and the sixth pipelines 1423 along the second direction D2. The fourth pipelines 1421, the fifth pipelines 1422 and the sixth pipelines 1423 are configured to allow the working medium to flow therein. In this embodiment, a quantity of the sixth pipelines 1423 is larger than a quantity of the fifth pipelines 1422.

In practical applications, similarly, the second cooling fins 141 can be chosen to be skived fins, or other fins of columnar shapes, flaky shapes or even irregular shapes. The gap between any adjacent two of the fins can allow an air flow to pass through. Moreover, under the condition that the contact area with the working medium is increased (such as increasing the density of arrangement), the heat can be transferred to the air flow more readily, such that the heat can be taken away by the air flow.

In this embodiment, as shown in FIGS. 3-4, the heat-conducting unit 115 includes a heat-conducting plate 1151 and a heat-conducting structure 1152. The heat-conducting plate 1151 is connected with the base 112 and has a heat absorbing surface 111. The heat absorbing surface 111 is away from the water-tank module 120 and is configured to abut against the heat source 200 in order to absorb the heat from the heat source 200. Thus, the material of the heat-conducting plate 1151 can be chosen from metallic materials or other materials of good conductivity. Structurally speaking, the heat-conducting plate 1151 can be an integral structure or a composite structure assembled from multiple layers or a plurality of elements. However, this does not intend to limit the present disclosure. Moreover, the heat-conducting structure 1152 is located within the first chamber C1 and is connected between the heat-conducting plate 1151 and the diversion block 1121 of the base 112. The heat-conducting structure 1152 can be chosen to be skived fins, or other fins of columnar shapes, flaky shapes or even irregular shapes. The gap between any adjacent two of the fins can allow the working medium to pass through. Moreover, under the condition that the contact area with the working medium is increased (such as increasing the density of arrangement), the heat can be transferred to the working medium more readily. When the heat absorbing surface 111 of the heat-conducting plate 1151 directly or indirectly forms a thermal contact with the heat source 200, the heat absorbing surface 111 of the heat-conducting plate 1151 absorbs the heat and then transfers to the heat-conducting structure 1152 located within the first chamber C1. The heat-conducting structure 1152 then transfers the heat to the working medium within the water-cooling module 110.

In practical applications, when the liquid-cooling heat dissipation device 100 operates, the heat source 200 abuts against the heat absorbing surface 111 of the heat-conducting unit 115, and the heat from the heat source 200 is transferred to the working medium within the water-cooling module 110 through the heat absorbing surface 111. Please refer to the flowing direction R as marked in FIG. 4 for the flowing route of the working medium within the liquid-cooling heat dissipation device 100. Under the action of the power module 150, the working medium within the water-cooling module 110 flows from the first chamber C1 to the first pipelines 1321 of the first water-cooling radiator 130 through the fifth through holes H5. Afterwards, the working medium flows from the seventh through holes H7 to the fourth chamber C4 of the water-tank module 120. The working medium in the fourth chamber C4 flows to the second pipelines 1322 of the first water-cooling radiator 130 through the eighth through holes H8. Afterwards, the working medium flows from the first through holes H1 to the second chamber C2 of the water-cooling module 110. The working medium in the second chamber C2 flows to the third pipelines 1323 of the first water-cooling radiator 130 through the second through holes H2. Afterwards, the working medium flows from the ninth through holes H9 to the fifth chamber C5 of the water-tank module 120. The working medium in the fifth chamber C5 flows from the first connecting pipe 152 of the power module 150 to the pump 151 (please refer to FIG. 3) through the first opening P1. After pressurized by the pump 151, the working medium flows to the sixth chamber C6 of the water-tank module 120 through the second connecting pipe 153 of the power module 150 and the second opening P2. At this point, the heat absorbed by the working medium is delivered out of the liquid-cooling heat dissipation device 100 through the guidance of the first cooling fins 131 of the first water-cooling radiator 130.

Furthermore, the working medium in the sixth chamber C6 flows to the fourth pipelines 1421 of the second water-cooling radiator 140 through the tenth through holes H10. Afterwards, the working medium flows from the third through holes H3 to the third chamber C3 of the water-cooling module 110. The working medium in the third chamber C3 flows to the fifth pipelines 1422 of the second water-cooling radiator 140 through the fourth through holes H4. Afterwards, the working medium flows from the eleventh through holes H11 to the seventh chamber C7 of the water-tank module 120. The working medium in the seventh chamber C7 flows to the sixth pipelines 1423 of the second water-cooling radiator 140 through the twelfth through holes H12. Afterwards, the working medium flows from the six through holes H6 to the first chamber C1 of the water-cooling module 110. At this point, another occasion of heat transfer of the working medium is carried out through the second cooling fins 141 of the second water-cooling radiator 140. The working medium in the first chamber C1 is accelerated to flow through the heat-conducting structure 1152 of the heat-conducting unit 115 under the guidance of the diversion block 1121, so as to absorb the heat of the heat-conducting unit 115 transferred from the heat source 200. Consequently, the cool air flow CAF takes away the heat absorbed by the working medium, and turns into hot air flow HAF which is then delivered out of the liquid-cooling heat dissipation device 100. It is worth to note that, in this embodiment, the cool air flow CAF flows in a direction starting from the sixth pipelines 1423 towards the first pipelines 1321. In other words, the cool air flow CAF first flows through the sixth pipelines 1423 of a relatively low temperature, and then turns into the hot air flow HAF after finally flowing through the first pipelines 1321 of a relatively high temperature. Thus, the effect of heat dissipation is optimized.

In other words, after the working medium absorbs the heat of the heat source 200 when flowing through the heat absorbing surface 111 of the water-cooling module 110, the working medium flows within the water-cooling module 110, the second water-cooling radiator 140, the water-tank module 120 and the first water-cooling radiator 130 under the action of the power module 150, such that a fluid circulation is formed within the liquid-cooling heat dissipation device 100. Moreover, two occasions of heat dissipation to the working medium are respectively carried out when the working medium flows through the first water-cooling radiator 130 and the second water-cooling radiator 140. Therefore, the effect of heat dissipation of the liquid-cooling heat dissipation device 100 is greatly enhanced.

It is worth to note that, when the cool air flow CAF penetrates through the second water-cooling radiator 140, fluid resistance to the cool air flow CAF is generated between the sixth pipelines 1423, the fifth pipelines 1422, the fourth pipelines 1421 and the second cooling fins 141. However, as mentioned above, since the first water-cooling radiator 130 and the second water-cooling radiator 140 define the pressure relief space SP therebetween, when the cool air flow CAF reaches the pressure relief space SP after penetrating through the second water-cooling radiator 140, the cool air flow CAF carrying a certain amount of heat no longer encounters any fluid resistance and is able to keep flowing towards the first water-cooling radiator 130. In this way, the process that the cool air flow CAF flows through the second water-cooling radiator 140 and the first water-cooling radiator 130 sequentially to turn into the hot air flow HAF becomes smoother, and the overall fluid resistance generated when penetrating through the liquid-cooling heat dissipation device 100 is effectively reduced. Thus, the effect of heat dissipation of the liquid-cooling heat dissipation device 100 is further enhanced.

In this embodiment, as shown in FIGS. 1, 2, and 4, the power module 150 is communicated with the water-tank module 120, and is located between the first water-cooling radiator 130 and the second water-cooling radiator 140. In other words, the power module 150 is at least partially located inside the pressure relief space SP.

Figure 6:
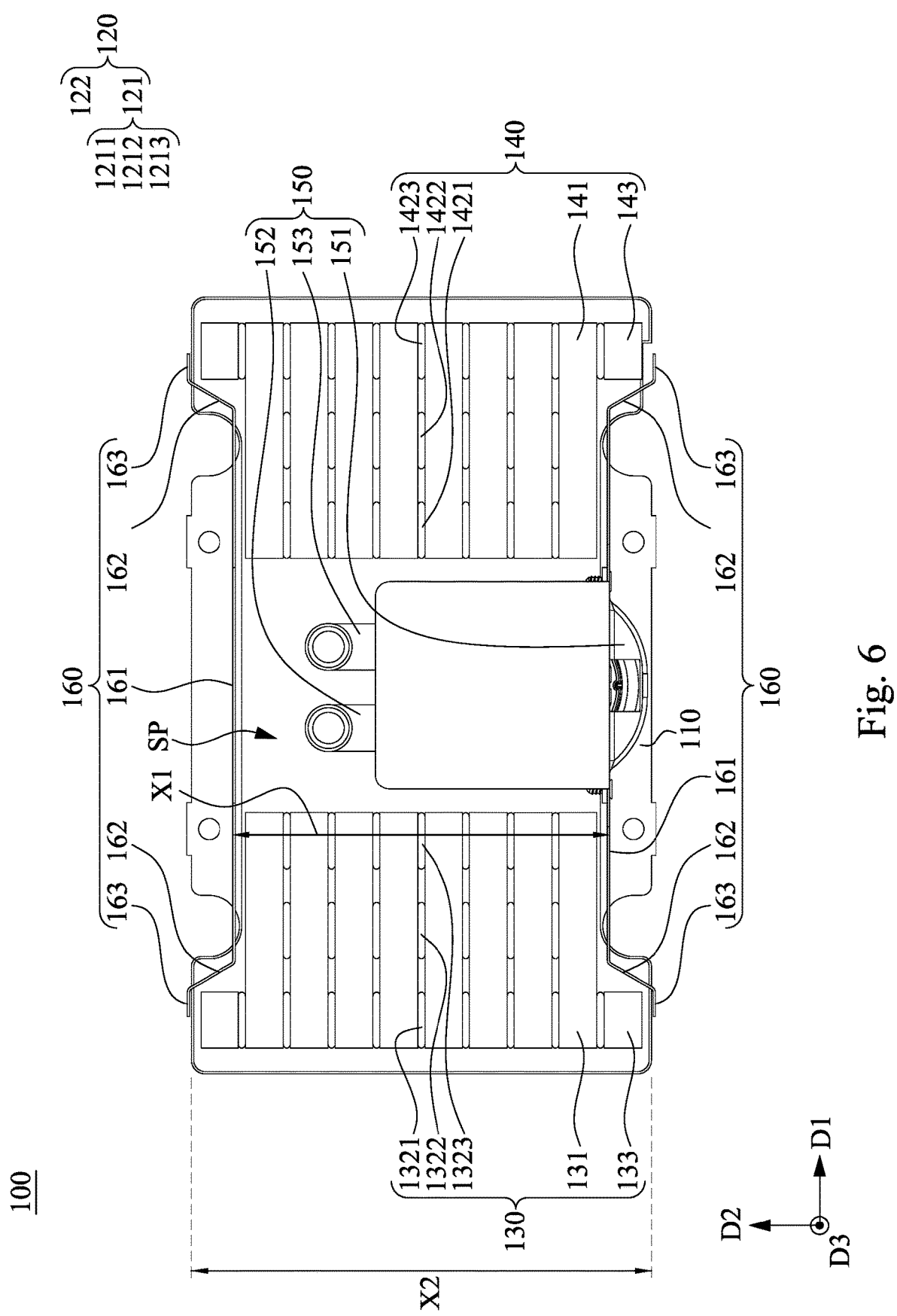
FIG. 6 is a top view of the liquid-cooling heat dissipation device of FIG. 1 after the water-tank module is removed.

Reference is made to FIG. 6. FIG. 6 is a top view of the liquid-cooling heat dissipation device 100 of FIG. 1 after the water-tank module 120 is removed. In this embodiment, as shown in FIGS. 3 and 6, each of the side covers 160 includes a main cover 161, two tapered segments 162 and two subsidiary covers 163. The main cover 161 is connected between the corresponding tapered segments 162 along the first direction D1. Each of the tapered segments 162 is connected between the corresponding main cover 161 and the corresponding one of the subsidiary covers 163. The main covers 161 define a first distance X1 therebetween. Each of the subsidiary covers 163 and the corresponding one of the subsidiary covers 163 define a second distance X2 therebetween. The second distance X2 is larger than the first distance X1.

As mentioned above, the quantity of the first pipelines 1321 is larger than the quantity of the second pipelines 1322, while the quantity of the sixth pipelines 1423 is also larger than the quantity of the fifth pipelines 1422. Correspondingly, as shown in FIGS. 3 and 6, the first water-cooling radiator 130 further includes a plurality of third cooling fins 133. The third cooling fins 133 correspond to the subsidiary covers 163 in position. To be more specific, the first pipelines 1321 are located between the third cooling fins 133, and the length of extension of the third cooling fins 133 along the first direction D1 is shorter than the first cooling fins 131. The third cooling fins 133 are at least partially located between the first pipelines 1321 and the corresponding one of the subsidiary covers 163. Similarly, the second water-cooling radiator 140 further includes a plurality of fourth cooling fins 143. The fourth cooling fins 143 correspond to the subsidiary covers 163 in position. To be more specific, the sixth pipelines 1423 are located between the fourth cooling fins 143, and the length of extension of the fourth cooling fins 143 along the first direction D1 is shorter than the second cooling fins 141. The fourth cooling fins 143 are at least partially located between the sixth pipelines 1423 and the corresponding one of the subsidiary covers 163.

Since the second distance X2 between one of the subsidiary covers 163 and the corresponding one of the subsidiary covers 163 is larger than the first distance X1 between one of the main covers 161 and the other one of the main covers 161, when the air flow (such as an air flow generated by a fan) enters from the outside of the liquid-cooling heat dissipation device 100 and sequentially passes through the second water-cooling radiator 140 and the first water-cooling radiator 130, the air flow is guided by the tapered segments 162 located between the main covers 161 and the subsidiary covers 163 such that the flowing speed of the air flow is increased. Thus, the effect of heat dissipation is effectively enhanced.

Figure 7:
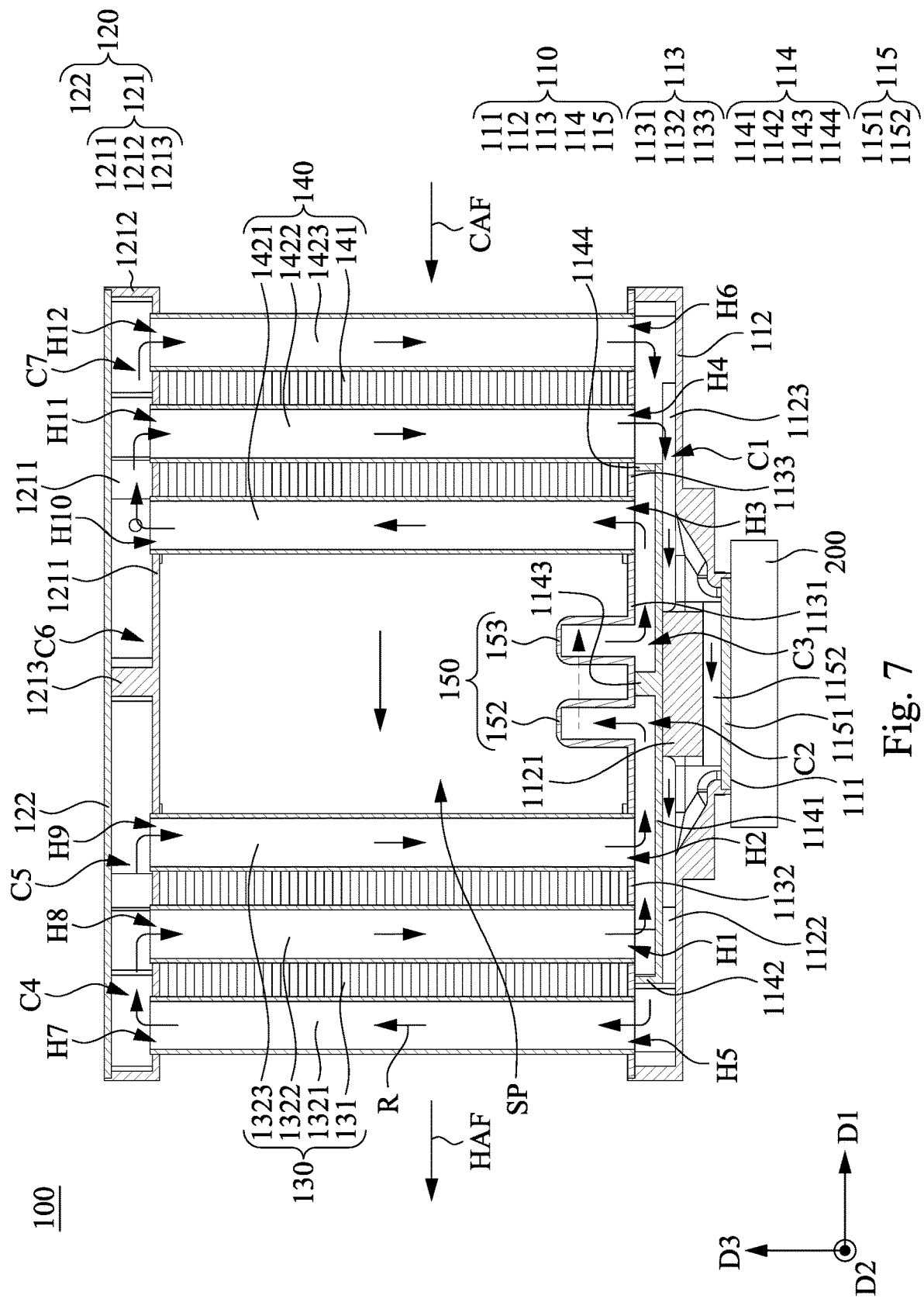
FIG. 7 is a sectional view of the liquid-cooling heat dissipation device according to another embodiment of the present disclosure.

Reference is made to FIG. 7. FIG. 7 is a sectional view of the liquid-cooling heat dissipation device 100 according to another embodiment of the present disclosure. In this embodiment, according to the actual conditions, the power module 150 is communicated with the water-cooling module 110. The second connecting pipe 153 is communicated with the second chamber C2. The first connecting pipe 152 is communicated with the third chamber C3. The fourth chamber C4 and the fifth chamber C5 of the water-tank module 120 are communicated with each other. The sixth chamber C6 and the seventh chamber C7 of the water-tank module 120 are communicated with each other. Moreover, the third isolating portion 1144 of the isolating structure 114 of the water-cooling module 110 is shifted towards the first isolating portion 1142, such that the fourth pipelines 1421 of the second water-cooling radiator 140 are communicated between the third chamber C3 and the sixth chamber C6, the fifth pipelines 1422 are communicated between the seventh chamber C7 and the first chamber C1, and the sixth pipelines 1423 are communicated between the seventh chamber C7 and the first chamber C1. In other words, in this embodiment, the third chamber C3 is only communicated with the fourth pipelines 1421, while the first chamber C1 is at the same time communicated with the first pipelines 1321, the fifth pipelines 1422 and the sixth pipelines 1423.

In practical applications, when the liquid-cooling heat dissipation device 100 operates, the heat source 200 abuts against the heat absorbing surface 111 of the heat-conducting unit 115, and the heat from the heat source 200 is transferred to the working medium within the water-cooling module 110 through the heat absorbing surface 111. Please refer to the flowing direction R as marked in FIG. 7 for the flowing route of the working medium within the liquid-cooling heat dissipation device 100. Under the action of the power module 150, the working medium within the water-cooling module 110 flows from the first chamber C1 to the first pipelines 1321 of the first water-cooling radiator 130 through the fifth through holes H5. Afterwards, the working medium flows from the seventh through holes H7 to the fourth chamber C4 of the water-tank module 120. A portion of the working medium in the fourth chamber C4 flows to the second chamber C2 of the water-cooling module 110 through the third pipelines 1323 of the first water-cooling radiator 130 after flowing into the fifth chamber C5 of the water-tank module 120, while another portion of the working medium in the fourth chamber C4 flows to the second chamber C2 of the water-cooling module 110 through the second pipelines 1322 of the first water-cooling radiator 130. The working medium in the second chamber C2 flows to the pump 151 (please refer to FIG. 3) through the first connecting pipe 152 of the power module 150. After pressurized by the pump 151, the working medium flows to the third chamber C3 of the water-cooling module 110 through the second connecting pipe 153 of the power module 150 (the flow of the working medium from the first connecting pipe 152 to the second connecting pipe 153 is presented by hidden lines in the figure).

Furthermore, the working medium in the third chamber C3 flows to the sixth chamber C6 of the water-tank module 120 through the fourth pipelines 1421 of the second water-cooling radiator 140. The working medium in the sixth chamber C6 flows to the first chamber C1 of the water-cooling module 110 through both of the fifth pipelines 1422 and the sixth pipelines 1423 of the second water-cooling radiator 140 after flowing into the seventh chamber C7 of the water-tank module 120. The working medium in the first chamber C1 is accelerated to flow through the heat-conducting structure 1152 of the heat-conducting unit 115 under the guidance of the diversion block 1121, so as to absorb the heat of the heat-conducting unit 115 transferred from the heat source 200. Through the circulation inside the liquid-cooling heat dissipation device 100 as mentioned above, the heat absorbed by the working medium is delivered out of the liquid-cooling heat dissipation device 100 after the sequential guidance of the first cooling fins 131 of the first water-cooling radiator 130 and the second cooling fins 141 of the second water-cooling radiator 140. Consequently, the cool air flow CAF takes away the heat absorbed by the working medium, and turns into hot air flow HAF which is then delivered out of the liquid-cooling heat dissipation device 100.

Figure 8:
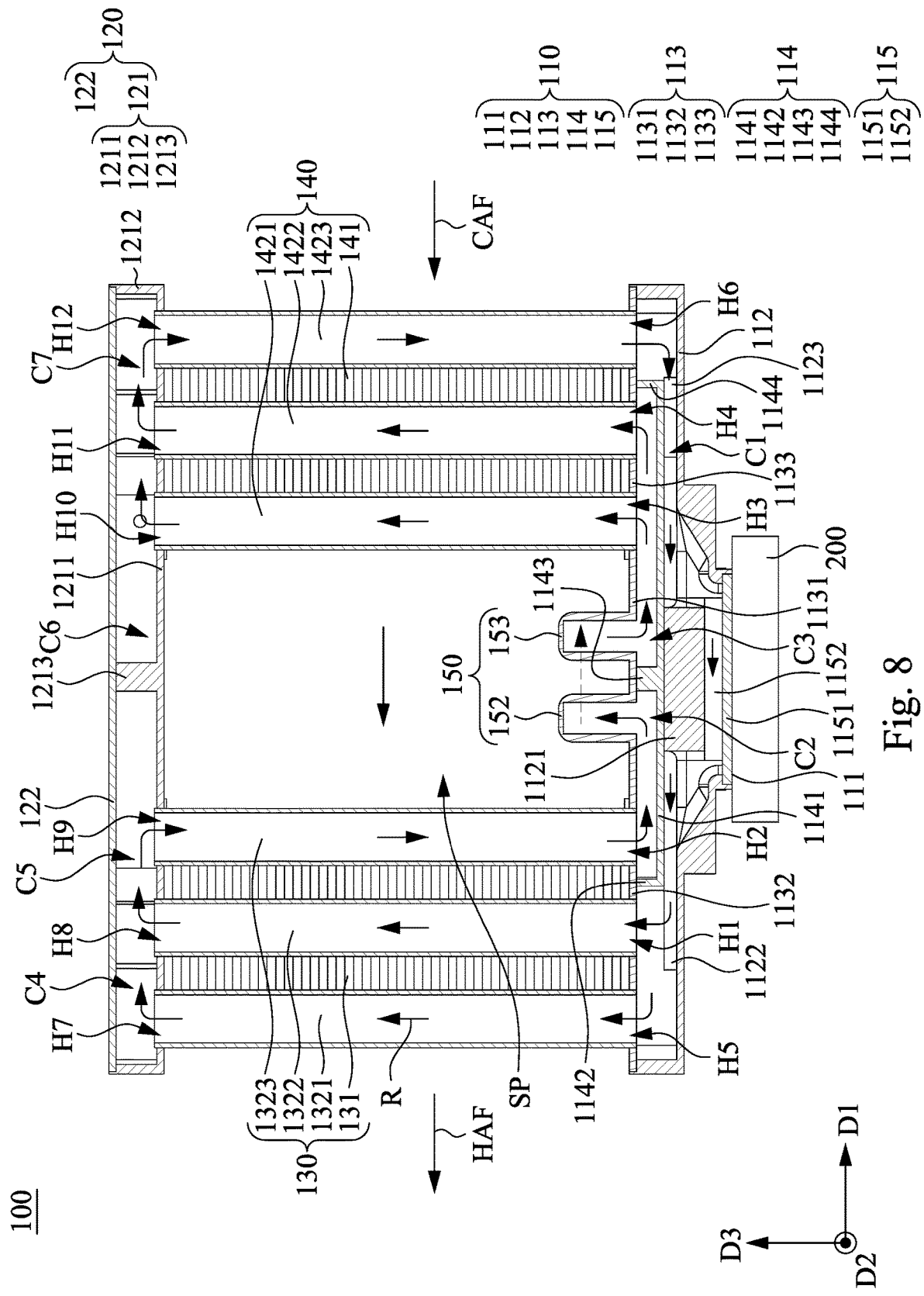
FIG. 8 is a sectional view of the liquid-cooling heat dissipation device according to a further embodiment of the present disclosure.

Reference is made to FIG. 8. FIG. 8 is a sectional view of the liquid-cooling heat dissipation device 100 according to a further embodiment of the present disclosure. In this embodiment, according to the actual conditions, the power module 150 is communicated with the water-cooling module 110. The first connecting pipe 152 is communicated with the second chamber C2. The second connecting pipe 153 is communicated with the third chamber C3. The fourth chamber C4 and the fifth chamber C5 of the water-tank module 120 are communicated with each other. The sixth chamber C6 and the seventh chamber C7 of the water-tank module 120 are communicated with each other. Moreover, the first isolating portion 1142 of the isolating structure 114 of the water-cooling module 110 is shifted towards the third isolating portion 1144, such that the first pipelines 1321 of the first water-cooling radiator 130 are communicated between the first chamber C1 and the fourth chamber C4, the second pipelines 1322 are communicated between the first chamber C1 and the fourth chamber C4, and the third pipelines 1323 are communicated between the second chamber C2 and the fifth chamber C5. In other words, in this embodiment, the second chamber C2 is only communicated with the third pipelines 1323, while the first chamber C1 is at the same time communicated with the first pipelines 1321, the second pipelines 1322 and the sixth pipelines 1423.

In practical applications, when the liquid-cooling heat dissipation device 100 operates, the heat source 200 abuts against the heat absorbing surface 111 of the heat-conducting unit 115, and the heat from the heat source 200 is transferred to the working medium within the water-cooling module 110 through the heat absorbing surface 111. Please refer to the flowing direction R as marked in FIG. 8 for the flowing route of the working medium within the liquid-cooling heat dissipation device 100. Under the action of the power module 150, the working medium within the water-cooling module 110 flows from the first chamber C1 to the fourth chamber C4 of the water-tank module 120 through both of the first pipelines 1321 and second pipelines 1322 of the first water-cooling radiator 130. The working medium in the fourth chamber C4 flows to the second chamber C2 of the water-cooling module 110 through the third pipelines 1323 of the first water-cooling radiator 130 after flowing into the fifth chamber C5 of the water-tank module 120. The working medium in the second chamber C2 flows to the pump 151 (please refer to FIG. 3) through the first connecting pipe 152 of the power module 150. After pressurized by the pump 151, the working medium flows to the third chamber C3 of the water-cooling module 110 through the second connecting pipe 153 of the power module 150 (the flow of the working medium from the first connecting pipe 152 to the second connecting pipe 153 is presented by hidden lines in the figure). At this point, the heat absorbed by the working medium is delivered out of the liquid-cooling heat dissipation device 100 after the guidance of the first cooling fins 131 of the first water-cooling radiator 130. Consequently, the cool air flow CAF takes away the heat absorbed by the working medium, and turns into hot air flow HAF which is then delivered out of the liquid-cooling heat dissipation device 100.

Furthermore, the working medium in the third chamber C3 flows to the sixth chamber C6 and the seventh chamber C7 of the water-tank module 120 through both of the fourth pipelines 1421 and the fifth pipelines 1422 of the second water-cooling radiator 140. Since the sixth chamber C6 and the seventh chamber C7 are communicated with each other, the working medium flows to the first chamber C1 of the water-cooling module 110 through the sixth pipelines 1423 of the second water-cooling radiator 140 after converging at the seventh chamber C7. The working medium in the first chamber C1 is accelerated to flow through the heat-conducting structure 1152 of the heat-conducting unit 115 under the guidance of the diversion block 1121, so as to absorb the heat of the heat-conducting unit 115 transferred from the heat source 200. Through the circulation inside the liquid-cooling heat dissipation device 100 as mentioned above, the heat absorbed by the working medium is delivered out of the liquid-cooling heat dissipation device 100 after the sequential guidance of the first cooling fins 131 of the first water-cooling radiator 130 and the second cooling fins 141 of the second water-cooling radiator 140. Consequently, the cool air flow CAF takes away the heat absorbed by the working medium, and turns into hot air flow HAF which is then delivered out of the liquid-cooling heat dissipation device 100.

In conclusion, when compared with the prior art, the aforementioned embodiments of the present disclosure have at least the following advantages:

(1) After the working medium absorbs the heat of the heat source when flowing through the heat absorbing surface of the water-cooling module, the working medium flows within the water-cooling module, the second water-cooling radiator, the water-tank module and the first water-cooling radiator under the action of the power module, such that a fluid circulation is formed within the liquid-cooling heat dissipation device. Moreover, two occasions of heat dissipation to the working medium are respectively carried out when the working medium flows through the first water-cooling radiator and the second water-cooling radiator. Therefore, the effect of heat dissipation of the liquid-cooling heat dissipation device is greatly enhanced.

(2) Since the second distance between one of the subsidiary covers and the corresponding one of the subsidiary covers is larger than the first distance between one of the main covers and the other one of the main covers, when the air flow enters from the outside of the liquid-cooling heat dissipation device and sequentially passes through the second water-cooling radiator and the first water-cooling radiator, the air flow is guided by the tapered segments located between the main covers and the subsidiary covers such that the flowing speed of the air flow is increased. Thus, the effect of heat dissipation is effectively enhanced.

(3) When the cool air flow penetrates through the second water-cooling radiator, fluid resistance to the cool air flow is generated between the sixth pipelines, the fifth pipelines, the fourth pipelines and the second cooling fins. However, since the first water-cooling radiator and the second water-cooling radiator define the pressure relief space therebetween, when the cool air flow reaches the pressure relief space after penetrating through the second water-cooling radiator, the cool air flow no longer encounters any fluid resistance and is able to keep flowing towards the first water-cooling radiator. In this way, the process that the cool air flow flows through the second water-cooling radiator and the first water-cooling radiator sequentially to turn into the hot air flow becomes smoother, and the overall fluid resistance generated when penetrating through the liquid-cooling heat dissipation device is effectively reduced. Thus, the effect of heat dissipation of the liquid-cooling heat dissipation device is further enhanced.

Although the present disclosure has been described in considerable detail with reference to certain embodiments thereof, other embodiments are possible. Therefore, the spirit and scope of the appended claims should not be limited to the description of the embodiments contained herein.

It will be apparent to the person having ordinary skill in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A liquid-cooling heat dissipation device, comprising:
    a water-cooling module, comprising:
        a base;
        a top plate comprising a first subsidiary top plate, a second subsidiary top plate and a third subsidiary top plate, the first subsidiary top plate being connected between the second subsidiary top plate and the third subsidiary top plate;
        an isolating structure connected between the base and the top plate, the second subsidiary top plate, the third subsidiary top plate, the isolating structure and the base defining a first chamber therebetween, the isolating structure and the first subsidiary top plate defining a second chamber and a third chamber therebetween, the first chamber, the second chamber and the third chamber being isolated from each other; and
        a heat-conducting unit connected with the base, the heat-conducting unit being at least partially located within the first chamber and at least partially exposed from the base, the heat-conducting unit being configured to abut against a heat source;
    a water-tank module;
    a first water-cooling radiator connected with the top plate and communicated between the water-cooling module and the water-tank module, the second subsidiary top plate at least partially abutting against the first water-cooling radiator;
    a second water-cooling radiator connected with the top plate and communicated between the water-cooling module and the water-tank module, the third subsidiary top plate at least partially abutting against the second water-cooling radiator; and
    a power module configured to drive a working medium to flow between the water-cooling module and the water-tank module through the first water-cooling radiator and the second water-cooling radiator.

2. The liquid-cooling heat dissipation device of claim 1, wherein the isolating structure comprises an isolating plate, a first isolating portion, a second isolating portion and a third isolating portion, the first isolating portion, the second isolating portion and the third isolating portion are respectively connected with the isolating plate and configured to abut against the top plate, the first isolating portion and the second isolating portion define the second chamber therebetween, the second isolating portion and the third isolating portion define the third chamber therebetween.

3. The liquid-cooling heat dissipation device of claim 2, wherein the first subsidiary top plate has a plurality of first through holes, a plurality of second through holes, a plurality of third through holes and a plurality of fourth through holes, the second isolating portion is located between the second through holes and the third through holes, the second through holes are located between the first through holes and the second isolating portion, the third through holes are located between the fourth through holes and the second isolating portion, the second subsidiary top plate has a plurality of fifth through holes, the first through holes are located between the fifth through holes and the second through holes, the third subsidiary top plate has a plurality of sixth through holes, the fourth through holes are located between the sixth through holes and the third through holes, the isolating structure is located between the fifth through holes and the sixth through holes, the fifth through holes and the sixth through holes are respectively communicated with the first chamber.

4. The liquid-cooling heat dissipation device of claim 3, wherein the water-tank module comprises:
    a tank comprising a base plate, a wall plate and a plurality of isolating pieces, the wall plate surrounds and connects to the base plate, the isolating pieces are respectively connected with the wall plate and the base plate to define a fourth chamber, a fifth chamber, a sixth chamber and a seventh chamber isolated from each other, the base plate has a plurality of seventh through holes, a plurality of eighth through holes, a plurality of ninth through holes, a plurality of tenth through holes, a plurality of eleventh through holes and a plurality of twelfth through holes, the seventh through holes and the eighth through holes are respectively communicated with the fourth chamber, the ninth through holes are communicated with the fifth chamber, the tenth through holes are communicated with the sixth chamber, the eleventh through holes and the twelfth through holes are respectively communicated with the seventh chamber; and
    a cover configured to connect with the wall plate and the isolating pieces to seal the fourth chamber, the fifth chamber, the sixth chamber and the seventh chamber.

5. The liquid-cooling heat dissipation device of claim 4, wherein the base plate has a first opening and a second opening, the first opening is communicated with the fifth chamber, the second opening is communicated with the sixth chamber, the power module comprises:
- a pump communicated with the first opening and the second opening to configure to exert a pressure to the working medium.

6. The liquid-cooling heat dissipation device of claim 4, wherein the first water-cooling radiator and the second water-cooling radiator are arranged along a first direction, the first water-cooling radiator comprises a plurality of first cooling fins, a plurality of first pipelines, a plurality of second pipelines and a plurality of third pipelines, the second pipelines are located between the first pipelines and the third pipelines along the first direction, the first pipelines, the second pipelines and the third pipelines are respectively separated from each other and at least partially arranged along a second direction, the second direction is substantially perpendicular to the first direction, the first pipelines are communicated between the fifth through holes and the seventh through holes, the second pipelines are communicated between the first through holes and the eighth through holes, the third pipelines are communicated between the second through holes and the ninth through holes, the first cooling fins are separated from each other along a third direction and distributed between the first pipelines, the second pipelines and the third pipelines along the second direction, the third direction is perpendicular to the first direction and the second direction, the first pipelines, the second pipelines and the third pipelines are configured to allow the working medium to flow therein.

7. The liquid-cooling heat dissipation device of claim 6, wherein a quantity of the first pipelines is larger than a quantity of the second pipelines.

8. The liquid-cooling heat dissipation device of claim 6, wherein the second water-cooling radiator comprises a plurality of second cooling fins, a plurality of fourth pipelines, a plurality of fifth pipelines and a plurality of sixth pipelines, the fifth pipelines are located between the fourth pipelines and the sixth pipelines along the first direction, the fourth pipelines, the fifth pipelines and the sixth pipelines are separated from each other and respectively arranged along the second direction, the fourth pipelines are communicated between the third through holes and the tenth through holes, the fifth pipelines are communicated between the four through holes and the eleventh through holes, the sixth pipelines are communicated between the six through holes and the twelfth through holes, the second cooling fins are separated from each other along the third direction and distributed between the fourth pipelines, the fifth pipelines and the sixth pipelines along the second direction, the fourth pipelines, the fifth pipelines and the sixth pipelines are configured to allow the working medium to flow therein.

9. The liquid-cooling heat dissipation device of claim 8, wherein a quantity of the sixth pipelines is larger than a quantity of the fifth pipelines.

10. The liquid-cooling heat dissipation device of claim 1, wherein the first water-cooling radiator and the second water-cooling radiator define a pressure relief space therebetween.

11. The liquid-cooling heat dissipation device of claim 10, further comprising:
- two side covers respectively connecting with a side of the water-cooling module and the water-tank module to cover the pressure relief space, the pressure relief space being located between the side covers.

12. The liquid-cooling heat dissipation device of claim 11, wherein the first water-cooling radiator and the second water-cooling radiator are arranged along a first direction, each of the side covers comprises a main cover, two tapered segments and two subsidiary covers, the main cover is connected between the tapered segments along the first direction, each of the tapered segments is connected between the main cover and the corresponding one of the subsidiary covers, the main covers define a first distance therebetween, each of the subsidiary covers and the corresponding one of the subsidiary covers define a second distance therebetween, the second distance is larger than the first distance.

13. The liquid-cooling heat dissipation device of claim 12, wherein the first water-cooling radiator further comprises:
- a plurality of third cooling fins corresponding to the subsidiary covers in position.

14. The liquid-cooling heat dissipation device of claim 12, wherein the second water-cooling radiator further comprises:
- a plurality of fourth cooling fins corresponding to the subsidiary covers in position.

15. The liquid-cooling heat dissipation device of claim 1, wherein the power module is located between the first water-cooling radiator and the second water-cooling radiator, and the power module is communicated with the water-tank module or the water-cooling module.

16. The liquid-cooling heat dissipation device of claim 1, wherein the heat-conducting unit comprises:
- a heat-conducting plate connected with the base and having a heat absorbing surface, the absorbing surface is away from the water-tank module and is configured to abut against the heat source; and
- a heat-conducting structure located within the first chamber and connected with the heat-conducting plate.

* * * * *